(12) United States Patent
Yang et al.

(10) Patent No.: US 12,317,758 B2
(45) Date of Patent: May 27, 2025

(54) SNSPD WITH INTEGRATED ALUMINUM NITRIDE SEED OR WAVEGUIDE LAYER

(71) Applicant: Applied Materials, Inc., Santa Clara, CA (US)

(72) Inventors: Zihao Yang, Santa Clara, CA (US); Mingwei Zhu, San Jose, CA (US); Nag B. Patibandla, Pleasanton, CA (US); Nir Yahav, Sunnyvale, CA (US); Robert Jan Visser, Menlo Park, CA (US); Adi de la Zerda, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/315,459

(22) Filed: May 10, 2023

(65) Prior Publication Data
US 2023/0309420 A1    Sep. 28, 2023

Related U.S. Application Data

(63) Continuation of application No. 17/163,274, filed on Jan. 29, 2021, now Pat. No. 11,653,576.

(60) Provisional application No. 62/969,637, filed on Feb. 3, 2020.

(51) Int. Cl.
*H10N 60/85* (2023.01)
*G01J 1/44* (2006.01)
*G02B 6/10* (2006.01)

(52) U.S. Cl.
CPC ............... *H10N 60/85* (2023.02); *G01J 1/44* (2013.01); *G02B 6/107* (2013.01); *G01J 2001/442* (2013.01)

(58) Field of Classification Search
CPC ...... G01J 1/44; G01J 2001/442; G02B 6/107; H10N 60/85
See application file for complete search history.

(56) References Cited

U.S. PATENT DOCUMENTS

| | | | |
|---|---|---|---|
| 4,726,890 A | 2/1988 | Thakoor et al. | |
| 4,746,373 A | 5/1988 | Yamada et al. | |
| 4,844,989 A | 7/1989 | Murduck et al. | |

(Continued)

FOREIGN PATENT DOCUMENTS

| | | |
|---|---|---|
| CN | 102829884 | 12/2012 |
| CN | 103579405 | 2/2014 |

(Continued)

OTHER PUBLICATIONS

International Search Report and Written Opinion in International Appln. No. PCT/US2021/015807, dated Nov. 16, 2021, 9 pages.

(Continued)

*Primary Examiner* — Kevin K Pyo
(74) *Attorney, Agent, or Firm* — Fish & Richardson P.C.

(57) ABSTRACT

A superconducting nanowire single photon detector (SNSPD) device includes a substrate having a top surface, an optical waveguide on the top surface of the substrate to receive light propagating substantially parallel to the top surface of the substrate, a seed layer of metal nitride on the optical waveguide, and a superconductive wire on the seed layer. The superconductive wire is a metal nitride different from the metal nitride of the seed layer and is optically coupled to the optical waveguide.

16 Claims, 7 Drawing Sheets

(56) References Cited

U.S. PATENT DOCUMENTS

| | | | |
|---|---|---|---|
| 5,394,655 A | 3/1995 | Allen et al. | |
| 5,558,563 A | 9/1996 | Cote et al. | |
| 6,328,858 B1 | 12/2001 | Felsenthal et al. | |
| 6,347,106 B1 | 2/2002 | Dijaili et al. | |
| 6,475,902 B1 | 11/2002 | Hausmann et al. | |
| 7,432,201 B2 | 10/2008 | Takehara et al. | |
| 7,563,715 B2 | 7/2009 | Haukka et al. | |
| 8,324,095 B2 | 12/2012 | Chung et al. | |
| 9,296,650 B1 | 3/2016 | Zhang et al. | |
| 9,726,536 B2 | 8/2017 | Bacher et al. | |
| 11,600,761 B2 * | 3/2023 | Yang | H10N 60/85 |
| 11,653,576 B2 | 5/2023 | Yang et al. | |
| 11,788,883 B2 | 10/2023 | Yang et al. | |
| 2005/0205416 A1 | 9/2005 | Stachowiak | |
| 2006/0169582 A1 | 8/2006 | Brown et al. | |
| 2008/0128745 A1 | 6/2008 | Mastro et al. | |
| 2008/0272463 A1 | 11/2008 | Scott et al. | |
| 2009/0020701 A1 | 1/2009 | Frey | |
| 2011/0165347 A1 | 7/2011 | Miller et al. | |
| 2012/0228122 A1 | 9/2012 | Minami | |
| 2013/0029848 A1 | 1/2013 | Gonzalez et al. | |
| 2013/0048489 A1 | 2/2013 | Yamguchi et al. | |
| 2013/0188903 A1 | 7/2013 | Sandhu et al. | |
| 2014/0034489 A1 | 2/2014 | Kajihara et al. | |
| 2014/0212088 A1 | 7/2014 | Ohira et al. | |
| 2014/0239309 A1 | 8/2014 | Ramdani et al. | |
| 2014/0299751 A1 | 10/2014 | Tang et al. | |
| 2014/0353476 A1 | 12/2014 | Bacher et al. | |
| 2016/0087160 A1 | 3/2016 | Cheng et al. | |
| 2016/0093508 A1 | 3/2016 | Ogawa | |
| 2016/0233328 A1 | 8/2016 | Cheng et al. | |
| 2017/0038260 A1 | 2/2017 | Fong | |
| 2018/0230586 A1 | 8/2018 | Wang et al. | |
| 2018/0364097 A1 | 12/2018 | Najafi | |
| 2019/0023106 A1 | 1/2019 | Gagliardi et al. | |
| 2019/0044051 A1 | 2/2019 | Caudillo et al. | |
| 2019/0148848 A1 | 5/2019 | Najafi et al. | |
| 2019/0178709 A1 | 6/2019 | Lee et al. | |
| 2019/0189816 A1 | 6/2019 | Najafi et al. | |
| 2020/0328319 A1 | 10/2020 | Mellor et al. | |
| 2020/0333179 A1 | 10/2020 | Chung et al. | |
| 2020/0341503 A1 | 10/2020 | Rios Ocampo et al. | |
| 2021/0088727 A1 | 3/2021 | Park et al. | |
| 2021/0239519 A1 | 8/2021 | Yang et al. | |
| 2021/0242390 A1 | 8/2021 | Yang et al. | |

FOREIGN PATENT DOCUMENTS

| | | |
|---|---|---|
| CN | 106558632 | 4/2017 |
| CN | 108666409 | 10/2018 |
| CN | 106549097 | 5/2019 |
| CN | 107564990 | 5/2019 |
| CN | 110057446 | 7/2019 |
| CN | 110346040 | 10/2019 |
| CN | 110635021 | 12/2019 |
| CN | 110931573 | 3/2020 |
| JP | H7-011438 | 2/1995 |
| JP | 2016-072454 | 5/2016 |
| JP | 2018-004444 | 1/2018 |
| JP | 2018-074026 | 5/2018 |
| JP | 2023-519480 | 5/2023 |
| WO | WO 2010/025068 | 3/2010 |
| WO | WO 2014/026724 | 2/2014 |

OTHER PUBLICATIONS

Office Action in Taiwanese Appln. No. 110102768, dated Mar. 14, 2022, 11 pages (with English search report).

Redaelli et al., "Design of broadband high-efficiency superconducting-nanowire single photon detectors," Superconductor Science and Technology, May 6, 2016, 29(6), 11 pages.

Schmidt et al., "AlN-buffered superconducting NbN nanowire single photon detector on GaAs," IEEE Transactions on Applied Superconductivity, Jun. 2017, 27(4), 5 pages.

Shiino et al., "Improvement of the critical temperature of superconducting NbTiN and NbN thin films using the AlN buffer layer," Supercond. Sci. Tech., Mar. 2010, 23(4):045004.

Office Action in Japanese Appln No. 2022-547194, dated Nov. 7, 2023, 8 pages (with English translation).

Goldsmith et al., "Influence of nitride buffer layers on superconducting properties of niobium nitride," J. Vac. Sci. Tehcnol. A, Sep. 18, 2018, 36(6): 061502-1-061502-7.

Office Action in Japanese Appln. No. 2022-547194, dated Apr. 30, 2024, 6 pages (with English translation).

Extended European Search Report in Appln. No. 21772562.1, dated Feb. 13, 2024, 9 pages.

Marsilil et al., "High quality superconducting NbN thin films on GaAs," Aug. 5, 2009, Supercond. Sci. Technol. 22(9): 7 pages.

Reithmaier et al., "On-chip time resolved detection of quantum dot emission using integrated superconducting single photon detectors", May 28, 2013, 3(1901): 6 pages.

Zhang et al., "Improvement of the superconducting properties of NbN thin film on single-crystal silicon substrate by using a TiN buffer layer," Mar. 7, 2013, Supercond. Sci. Technol. 26(045010): 6 pages.

Office Action in Japanese Appln. No. 2022-547194, mailed Jan. 14, 2025, 5 pages (with English translation).

Schuck, "NbTiN superconducting nanowire detectors for visible and telecom wavelengths single photon counting on Si3N4 photonic circuits," Appl. Phys. Lett., 2013, 102(5):051101, 5 pages.

\* cited by examiner

SNSPD WITH INTEGRATED ALUMINUM NITRIDE SEED OR WAVEGUIDE LAYER

CROSS-REFERENCE TO RELATED APPLICATIONS

This application is a continuation of U.S. application Ser. No. 17/163,274, filed Jan. 29, 2021, which claims priority to U.S. Provisional Application No. 62/969,637, filed on Feb. 3, 2020, the disclosure of which is incorporated by reference.

BACKGROUND

Technical Field

The disclosure concerns a superconducting nanowire single photon detector (SNSPD) that includes a seed layer below the metal nitride that provides the superconductive material.

Background Discussion

In the context of superconductivity, the critical temperature (Tc) refers to the temperature below which a material becomes superconductive. Niobium nitride (NbN) is a material that can be used for superconducting applications, e.g., superconducting nanowire single photon detectors (SNSPD) for use in quantum information processing, defect analysis in CMOS, LIDAR, etc. The critical temperature of niobium nitride depends on the crystalline structure and atomic ratio of the material. For example, referring to FIG. 1, cubic δ-phase NbN has some advantages due to its relatively "high" critical temperature, e.g., 9.7-16.5° K.

Niobium nitride can be deposited on a workpiece by physical vapor deposition (PVD). For example, a sputtering operation can be performed using a niobium target in the presence of nitrogen gas. The sputtering can be performed by inducing a plasma in the reactor chamber that contains the target and the workpiece.

SUMMARY

In one aspect, a superconducting nanowire single photon detector (SNSPD) device includes a substrate having a top surface, an optical waveguide on the top surface of the substrate to receive light propagating substantially parallel to the top surface of the substrate, a seed layer of metal nitride on the optical waveguide, and a superconductive wire on the seed layer. The superconductive wire is a metal nitride different from the metal nitride of the seed layer and is optically coupled to the optical waveguide.

In another aspect, a superconducting nanowire single photon detector (SNSPD) device includes a substrate having a top surface, a metal nitride optical waveguide on the top surface of the substrate to receive light propagating substantially parallel to the top surface of the substrate, and a superconductive wire on the optical waveguide. The superconductive wire is a metal nitride selected from the group consisting of niobium nitride, titanium nitride, and niobium titanium nitride. The metal nitride of the optical waveguide is different from the metal nitride of the superconductive wire.

Implementations may provide, but are not limited to, one or more of the following advantages. A device based on absorption of photons by a superconductive material, e.g., an SNSPD, can have high photon absorption efficiency while also achieving high material quality for the superconductive layer, e.g. the niobium nitride, and thus a higher critical temperature. This permits fabrication of devices, e.g., SNSPD, with superconductive wires with a higher critical temperature. The larger difference between the operating temperature (2-3° K) and the critical temperature provides superior detection efficiency, lower dark count, and possibly faster temporal response.

It should be noted that "superconductive" indicates that the material becomes superconducting at the operating temperature of the device, e.g., 2-3° K. The material is not actually superconducting during fabrication of the device at or above room temperature or when the device is not being cooled for operation.

The details of one or more implementations are set forth in the accompanying drawings and the description below. Other potential aspects, features, and advantages will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
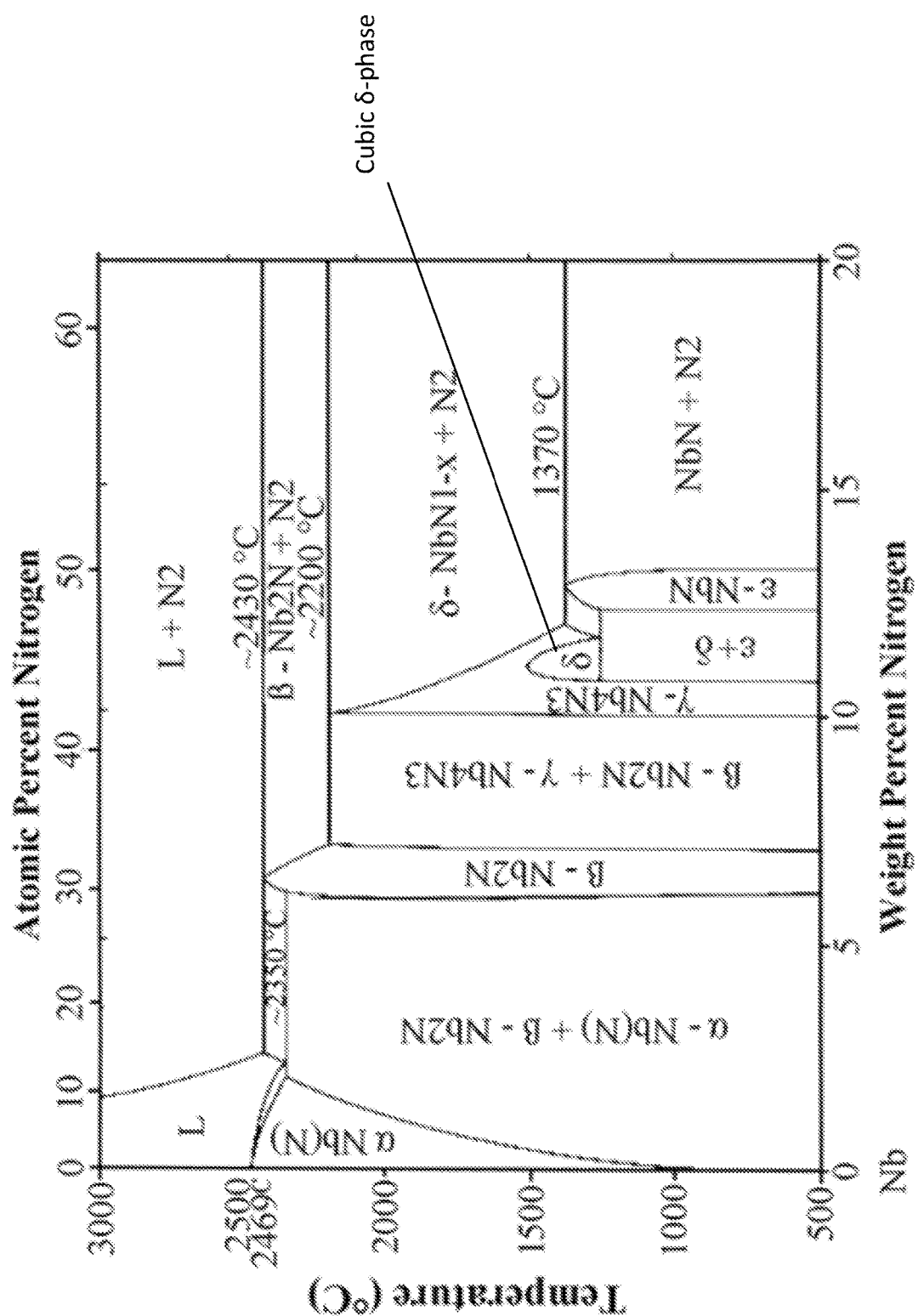
FIG. 1 diagram illustrating phase of niobium nitride as a function of processing temperature and atomic percentage nitrogen.
Figure 2A:
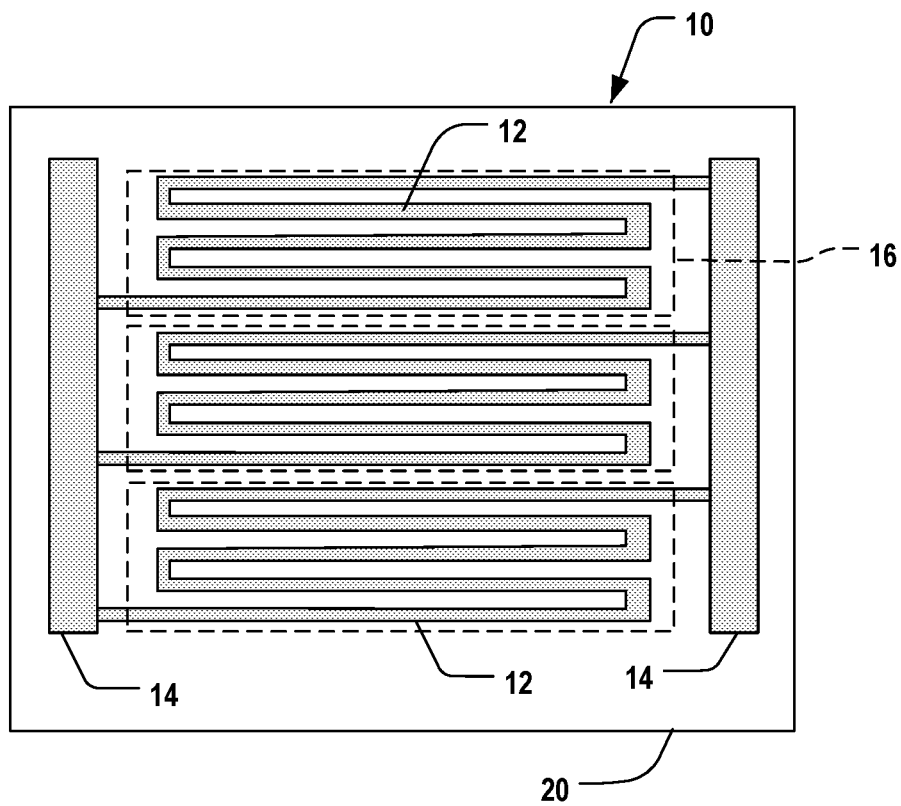
FIG. 2A is a schematic top view of a SNSPD that includes a distributed Bragg reflector.
Figure 2B:
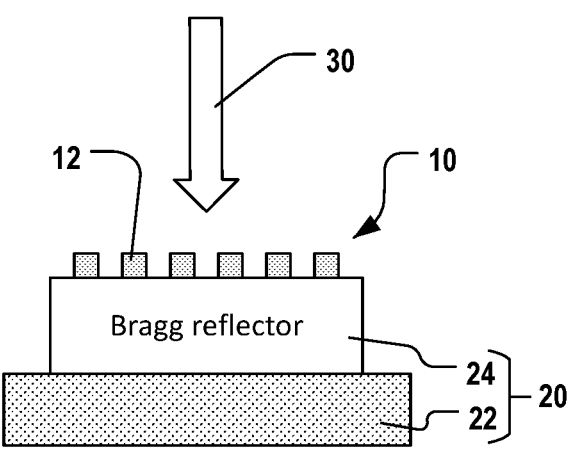
FIG. 2B is a schematic cross-sectional side view of the device of FIG. 2A.

FIGS. 2A and 2B illustrate top and side views, respectively, of a conventional superconducting nanowire single photon detector (SNSPD) device 10. The SNSPD device 10 can include at least one superconductive wire 12 disposed on a support structure 20. The superconductive wire 12 can be connected between conductive electrodes 14. The superconductive wire 12 can be arranged in a meandering pattern, e.g., a back-and-forth parallel lines, on the supporting structure 20. In some implementations, multiple wires 12 are connected in parallel between the electrodes 14, with each wire 12 covering a separate area 16, but there could be just a single wire 12 covering the entire detection area of the device 10. In addition, many other patterns are possible, e.g., zigzag or double spiral. The superconductive wire can be considered a nanowire, e.g., can have a width of about 30 nm and a thickness of about 10 nm.

The support structure 20 can include a substrate 22, e.g., a silicon substrate, and a mirror structure 24 disposed on the substrate 22. As an example, the mirror structure 24 can be a distributed Bragg reflector (DBR) that includes multiple pairs of layers formed of high refractive index and low refractive index materials.

A conventional SNSPD is operated with a photon (illustrated by light beam 30) approaching from the top of the device 10, e.g., with normal incidence relative to the substrate 20. A simple device would be have the NbN nanowires disposed directly on the silicon substrate (without the mirror structure). Because the NbN nanowires are typically very thin in a SNSPD device, most of the light is not absorbed by the NbN nanowire. To boost the light absorption efficiency, the mirror structure 24, e.g., the distributed Bragg reflector, is incorporated in the device 10 between the substrate 20 and the wires 12. In this case, incident photons that are not initially absorbed can be absorbed on reflection, so the photons have a higher probability to be captured by the NbN nanowires.

Figure 3:
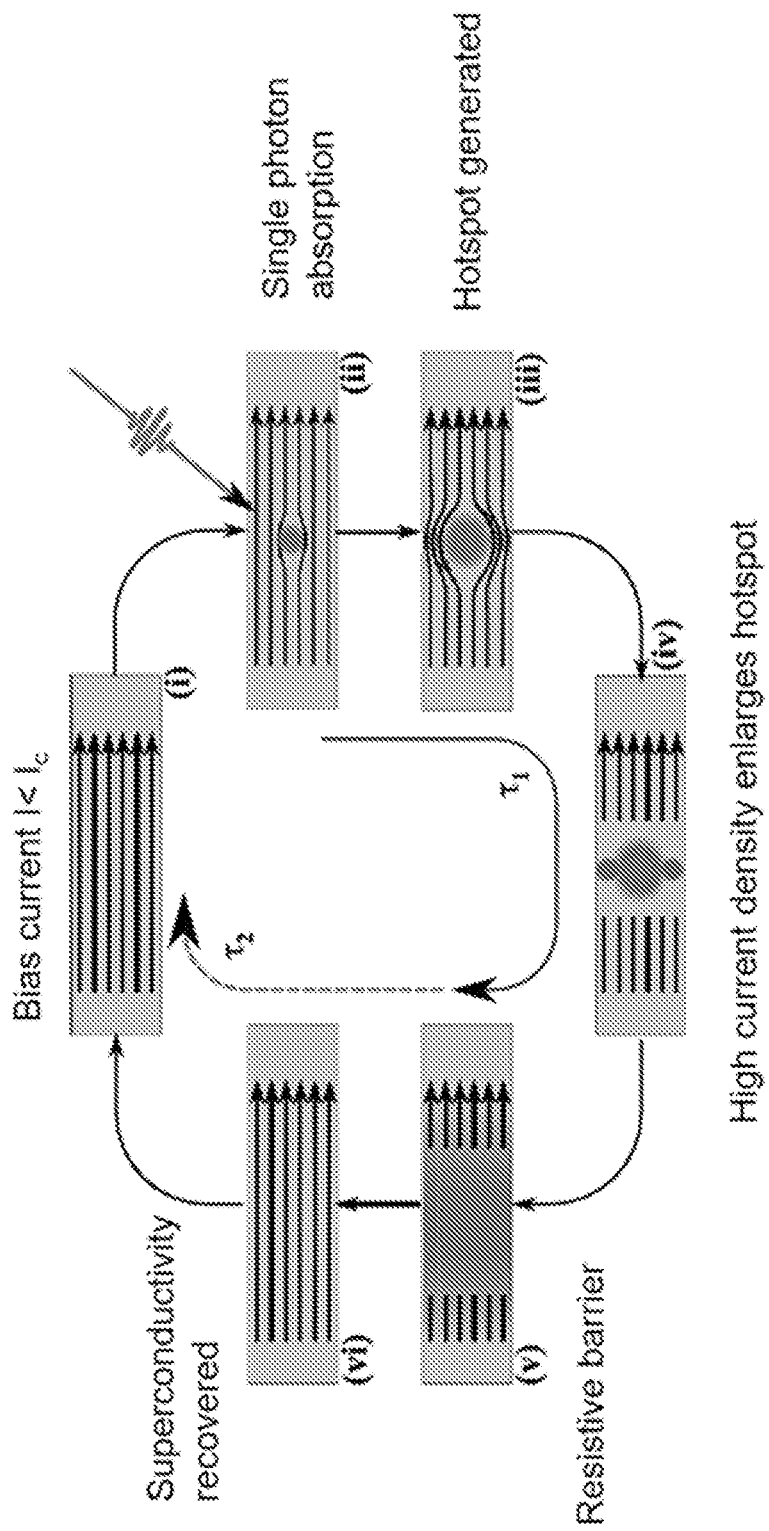
FIG. 3 is a schematic illustration of the operation of a SNSPD.

Referring to FIG. 3, the working principle of the SNSPD device is that the to-be-detected photon comes from top and shines on the SNPSD. Absorption of the photon creates a hot spot on the NbN nanowire which raises the temperature of the NbN above critical temperature so that a portion of the wire is no longer in the superconductive state. A region around the hot spot can experience current crowding, resulting in a higher current density than the critical current density, which can disrupt the superconductive state for the entire wire. The change in the NbN wire from the superconducting state to the normal resistive state can be electrically detected by flowing a current through the device and monitoring voltage differences between the electrodes.

NbN based SNSPDs are mainly used for time-correlated single-photon counting (TCPSC) related applications in the visible and infrared wavelength. For example, SNSPDs are used in quantum metrology (quantum key generation, quantum emitter) and optical quantum computing (detection module) due to their high efficiency, low dark count, low timing jitter, and fast recover time. They can be also used as detectors in classical space-to-ground communications and time-of-flight LIDAR system.

In the visible wavelength range, Si avalanche photodiodes (APDs) are typically used. The system detection efficiency is not ideal, e.g., is about 70%, and these devices are hard to integrate with chip-scale devices.

In the infrared wavelength range, InGaAs APDs are a candidate for many applications. But these devices usually suffer from high dark count rates and even lower system detection efficiency (<30%) with limited detection speed. Compared to APDs, SNSPDs, have superior performance which includes low timing jitter (<20 ps), fast recover time, high detection efficiency (>85%), and low dark count rates (~a few Hz).

As noted above, niobium nitride, particularly δ-phase NbN, has some advantages as a superconductive material. However, δ-phase NbN can be difficult to deposit at a satisfactory quality. A seed layer, e.g., an aluminum nitride (AlN) layer, below the (super)conductive layer can help improve the critical temperature of the NbN layer. The aluminum nitride (AlN) seed layer can also improve the critical temperature of TiN and NbTiN layers, and may also be helpful for other metal nitride layers. In particular, the aluminum nitride layer can be integrated into a SNSPD device, and in particular be integrated into the mirror structure or waveguide of a SNSPD device. This permits a higher crystal quality metal nitride detector (thus higher critical temperature, and thus better device performance) to be achieved while also enabling high light absorption efficiency.

Figure 4:
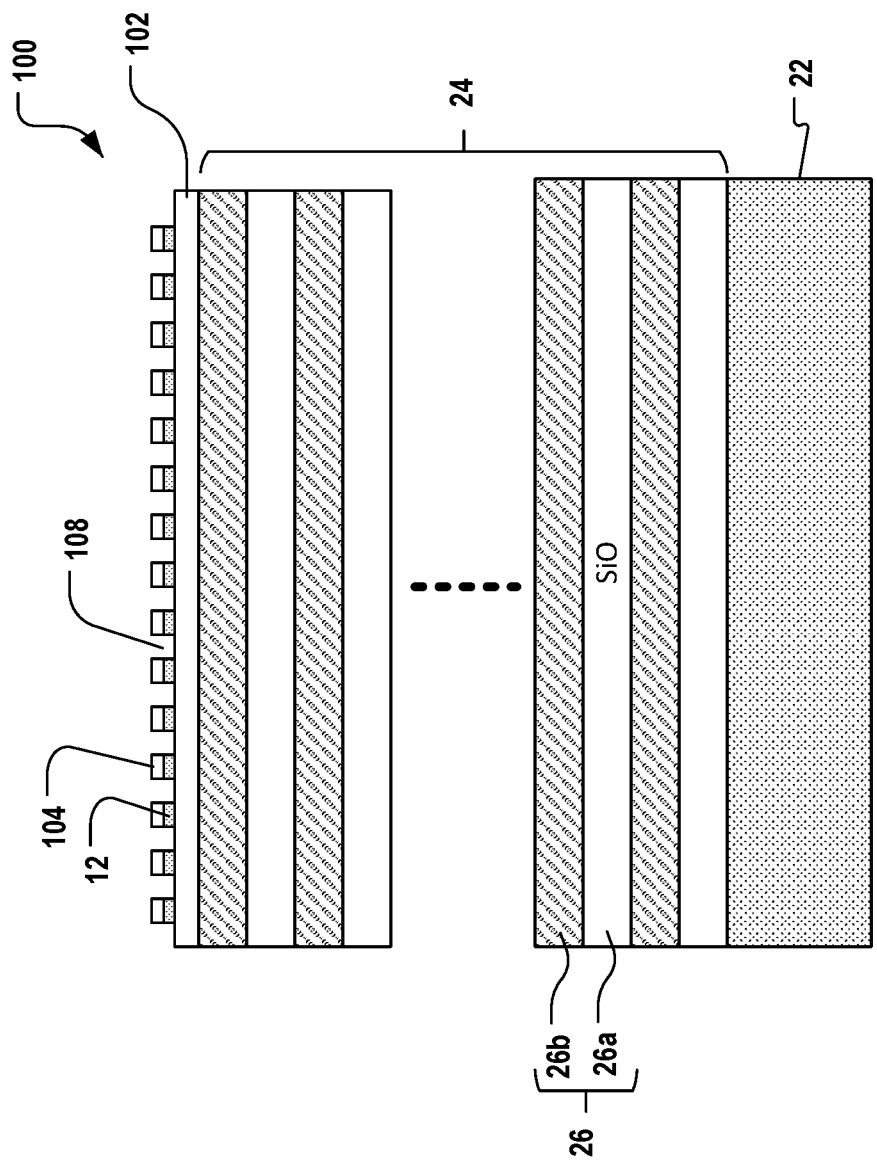
FIG. 4 is a schematic cross-sectional side view of a SNSPD that includes a distributed Bragg reflector and an aluminum nitride seed layer.

FIG. 4 illustrates a cross-sectional side view of a superconducting nanowire single photon detector (SNSPD) device 100. The SNSPD device 100 can be similar to the device described above with respect to FIGS. 2A and 2B, except as described below.

The SNSPD includes a substrate 22, which can be a dielectric material, e.g., sapphire, $SiO_2$, fused silica, or quartz, or a semiconductor material, e.g., silicon, gallium nitride (GaN) or gallium arsenide (GaAs).

A distributed Bragg reflector (DBR) 24 is fabricated on top of the substrate 22. The DBR 24 includes multiple bi-layers 26, e.g., two to eight bi-layers, e.g., seven bi-layers. Each bi-layer 26 includes a lower layer 26a of a first material having a first index of refraction (the "low index of refraction") and an upper layer 26b of a second material having a second index of refraction (the "high index of refraction") that is greater than the first index refraction. The thicknesses and materials (and thus indices of refraction) in the bilayers 26 are selected to increase reflection in a selected wavelength or wavelength band. For example, the DBR may be optimized for reflection of light of about 1500-1600 nm, as 1550 nm is a widely used wavelength in optical communication systems.

The first material and the second material can both be selected from Table 1, subject to the restriction that the second material has a higher index of refraction than the first material.

TABLE 1

| Material | Refractive index (for 1550 nm light) |
| --- | --- |
| a-Si | ~3.4-3.5 |
| $TiO_2$ | ~2.2-2.3 |
| $Nb_2O_5$ | ~2.1-2.2 |
| $Ta_2O_5$ | ~2.05-2.15 |
| AlN | ~1.95-2.05 |
| $Si_3N_4$ | ~1.9-2.0 |
| $SiO_2$ | ~1.4-1.5 |

Covering the upper layer 26b of the topmost bilayer 26 of the distributed Bragg reflector, e.g., in direct contact with the upper layer 26b, is a metal nitride seed layer 102. The seed layer 102 and the superconductive wires 12 are nitrides of different metals. In particular, the seed layer 102 can be aluminum nitride (AlN), as this improves the critical temperature of NbN. However, hafnium nitride (HfN), gallium nitride (GaN) might also be suitable. The metal nitride seed layer 102 can have a thickness of about 4 to 50 nm, e.g., about 5 nm or about 10 nm or about 20 nm thickness. The seed layer 102 can have a (002) c-axis crystal orientation. The seed layer 102 is not superconducting at the operating temperature of the device 100. The seed layer 102 can be deposited by a standard chemical vapor deposition or physical vapor deposition process.

Figure 5:
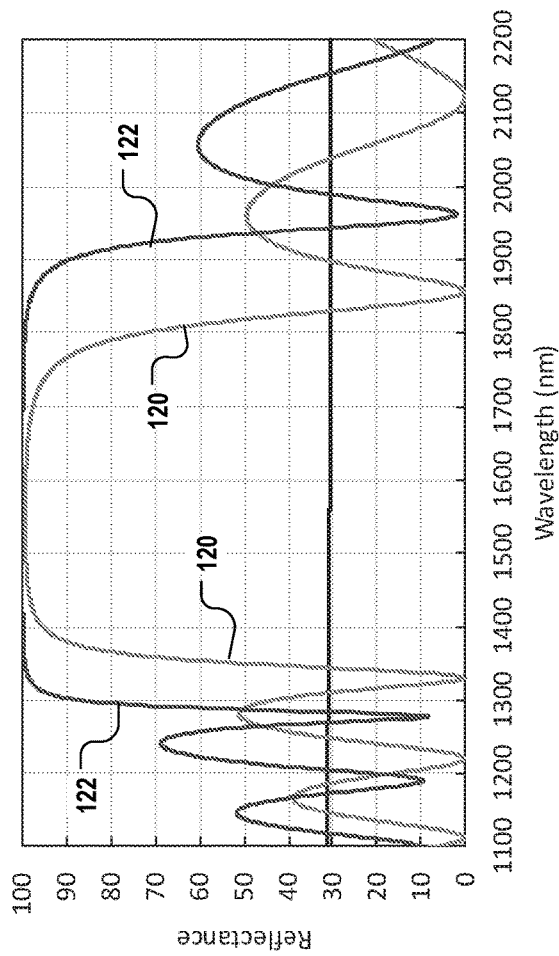
FIG. 5 is a graph of reflectance as a function of wavelength for two SNSPD designs.

In some implementations, the high index of refraction material of the upper layer 26b is $Ta_2O_5$, e.g., of about 182 nm thickness, and the low index of refraction material of the lower layer 26a is $SiO_2$, e.g., of about 263 nm thickness. The reflectance, as simulated by optical modelling software, of a stack of seven such bilayers with an AlN seed layer of 20 nm thickness is shown by curve 120 in FIG. 5.

In an embodiment of particular interest, the seed layer 102 is aluminum nitride, and the low-index material, i.e., the material of each lower layer 26a, is also aluminum nitride. This permits the seed layer 102 to be fabricated using the same processing conditions as the lower-layers in the distributed Bragg reflector 24, and thus simplifies processing requirements. In some implementations, the high index of refraction material is amorphous silicon (a-Si), e.g., of about 111 nm thickness, and the low index of refraction material is AlN, e.g., of about 197 nm thickness. The reflectance, as simulated by optical modelling software, of a stack of seven such bilayers with an AlN seed layer of 20 nm thickness is shown by curve 122 in FIG. 5.

The superconductive wires 12 are formed on, e.g., in direct contact with, the seed layer 102. The wires are formed of niobium nitride (NbN), titanium nitride (TiN), or niobium titanium nitride ($Nb_XTi_{1-X}N$). The wires 12 can have a width of about 25 to 250 nm, e.g., about 60 nm, and a thickness of 4 to 50 nm, e.g., about 5 nm or about 10 nm or about 20 nm.

Figure 6:
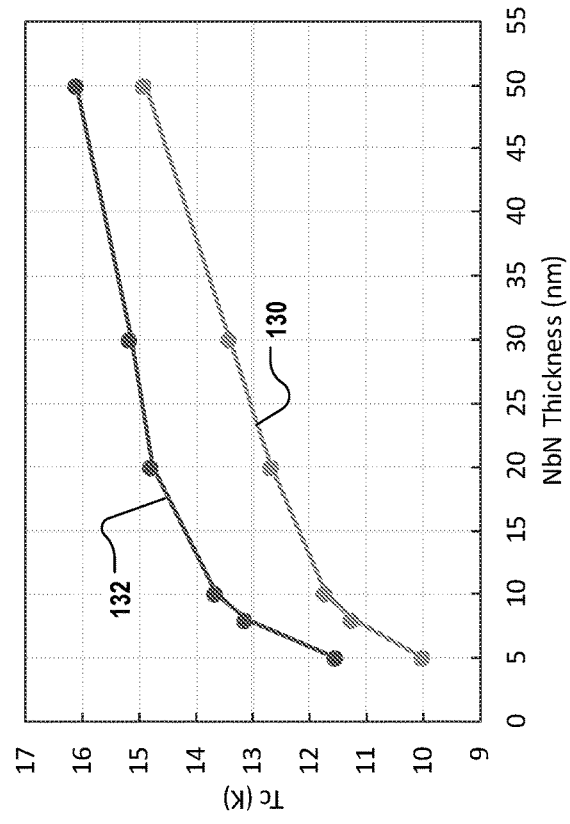
FIG. 6 is a graph of critical temperature as a function of thickness of a NbN layer, with and without an aluminum nitride seed layer.

The seed layer 102 helps improve the critical temperature of the aluminum nitride, especially when the aluminum nitride layer is thin. For example, FIG. 6 illustrates the measured critical temperature Tc (in Kelvin) as a function of thickness of a NbN layer. Curve 130 illustrates the critical temperature without an aluminum nitride seed layer, and curve 132 illustrates the critical temperature with an aluminum nitride seed layer (for a simplified stack of a silicon wafer, AlN seed layer, and NbN layer). Alternatively or in addition, the seed layer 102 can improve adhesion between the aluminum nitride layer 102 and the upper layer 26b of the distributed Bragg reflector 24.

Figure 7:
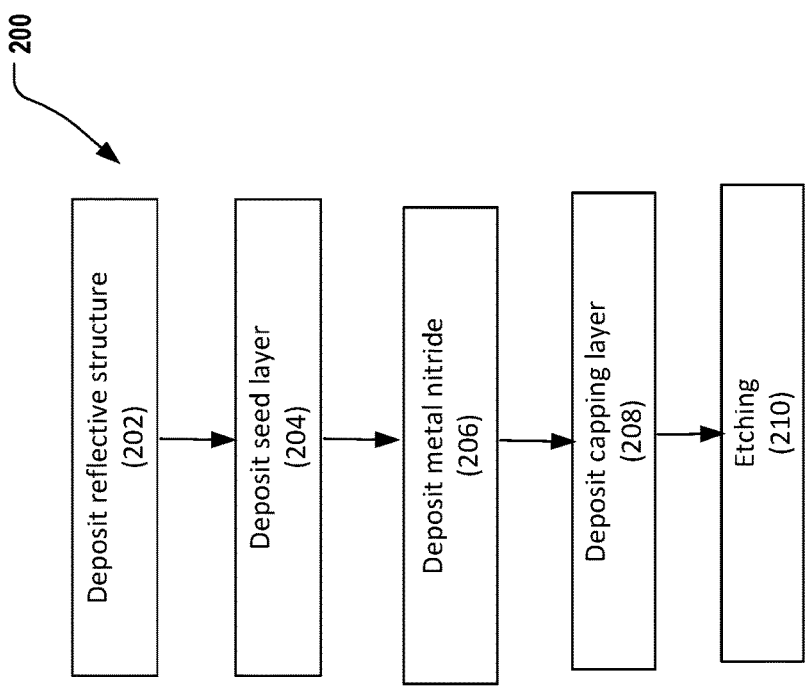
FIG. 7 is a flow chart of a method of fabricating a SNSPD.

FIG. 7 is a flowchart of a method 200 of fabrication of the device 100 of FIG. 4.

Initially, the distributed Bragg reflector (DBR) 24 is deposited on a substrate 100 (step 202). The substrate can be, for example, a silicon wafer. Although illustrated as a single block, the substrate 22 could include multiple underlying layers. The DBR 24 can be deposited by alternating deposition of the high and low index materials using a standard chemical vapor deposition or physical vapor deposition process.

Next, the seed layer 102 is deposited on the DBR 24 (step 204). As mentioned above, the seed layer 102 can be aluminum nitride. The seed layer can be deposited using a standard chemical vapor deposition or physical vapor deposition process. Exemplary processing parameters are a power applied to the sputtering target of 1-5 kW, a total pressure (nitrogen and inert gas) of 2 to 20 mTorr with nitrogen gas and inert gas supplied at a ratio between 3:100 and 1:6, a wafer temperature of 200-500° C., and no bias voltage applied to the wafer. In some implementations, the seed layer 102 is deposited in the same processing chamber that is used to deposit the DBR 24, e.g., by switching in a new target. This permits higher throughput manufacturing. Alternatively, the substrate can be transported to a different deposition chamber without breaking vacuum. Either case permits the seed layer to be deposited without exposure of the DBR to atmosphere and with lower risk of contamination.

Next, the metal nitride layer 12, e.g., the niobium nitride (NbN), titanium nitride (TiN), or niobium titanium nitride ($Nb_XTi_{1-X}N$), is deposited on the seed layer (step 206). The metal nitride layer 12 can be deposited using a standard chemical vapor deposition or physical vapor deposition process. Exemplary processing parameters are a base pressure of 1 e-8 Torr, a power applied to the target of 1-3 kW, a total pressure during processing of 5-7 mTorr, a wafer temperature of 400 C, no bias voltage applied to the wafer, and a percentage of the gas as $N_2$ sufficient to achieve cubic δ-phase NbN. In some implementations, the metal nitride layer 12 is deposited in the same processing chamber that is used to deposit the seed layer 102, e.g., by switching in a new target. This permits higher throughput manufacturing. Alternatively, the substrate can be transported to a different deposition chamber without breaking vacuum. This permits the metal nitride layer to be deposited without exposure of the seed layer to atmosphere and with lower risk of contamination.

After the metal nitride layer 12 is deposited, a capping layer 104 can be deposited on the metal nitride layer 12 (step 208). The capping layer 104 serves as a protective layer, e.g., to prevent oxidation of the metal nitride layer 12 or other types of contamination or damage. The capping layer 104 can be dielectric or conductive but is not superconductive at the operating temperature of the device 100. The capping layer 104 can be amorphous silicon (a-Si). In some implementations, the capping layer 104 is a nitride of a different material from the metal of the metal nitride used for the superconductive layer 12. Examples of materials for the capping layer 104 include AlN, $Al_2O_3$, $SiO_2$, and SiN. The capping layer 104 can be deposited by a standard chemical vapor deposition or physical vapor deposition process.

Etching can be used to form trenches 108 through at least the metal nitride layer 12 to form the conductive wires 12 or other structures needed for the device 100 (step 210). Although FIG. 4 illustrates the trench as extending through the metal nitride layer 12 and capping layer 104, other configurations are possible. As an example, the trenches can extend partially into or entirely through the seed layer 102. However, the trenches should not extend into the mirror structure 24.

Figure 8A:
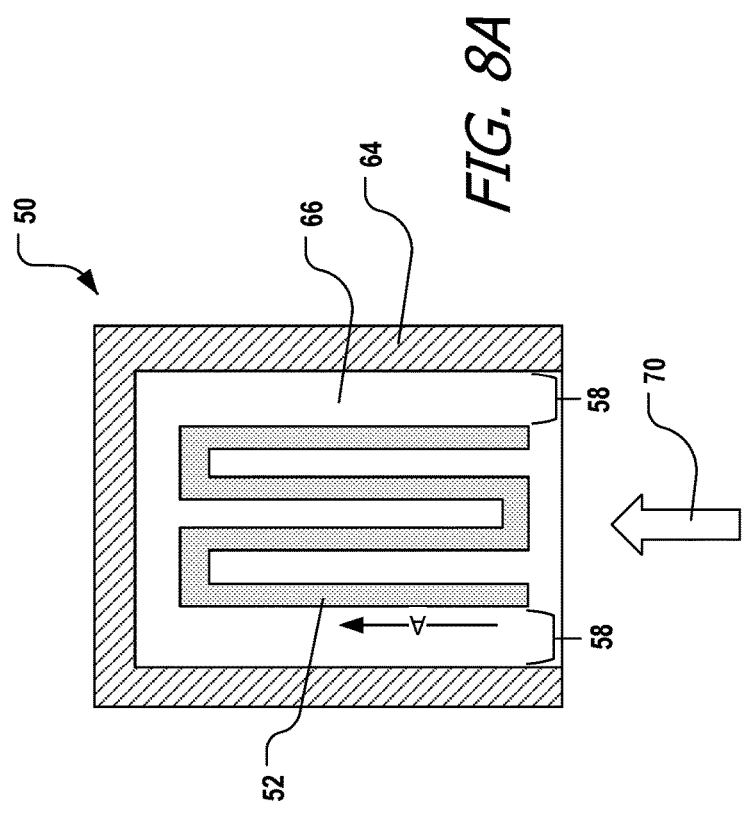
FIG. 8A is a schematic top view of a SNSPD that includes a waveguide.
Figure 8B:
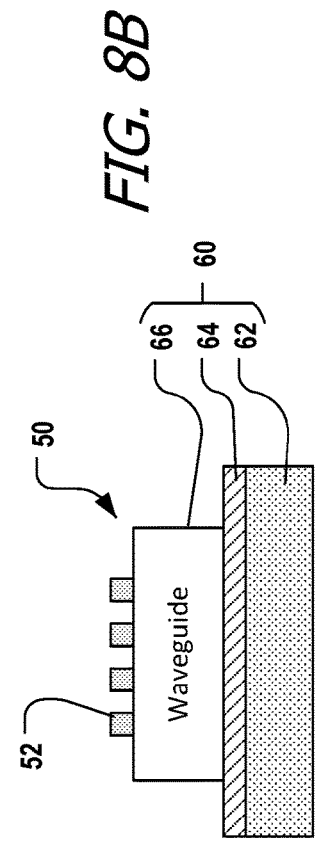
FIG. 8B is a schematic cross-sectional side view of the device of FIG. 8A.

Another form of superconducting nanowire single photon detector (SNSPD) device includes a waveguide to input photons into the detector along an axis generally parallel to the surface of the substrate. FIGS. 8A and 8B illustrate a conventional SNSPD 50 having such a waveguide. The SNSPD 50 can include at least one superconductive wire 52 disposed on a support structure 60. The support structure can include a substrate 62, e.g., a silicon substrate, a dielectric layer 64 on the substrate 62, and a waveguide 66 disposed on the dielectric layer 64. The dielectric layer 64 is a first material having a first refractive index, and the waveguide 66 is a second material having a second refractive index that is higher than the first refractive index.

The superconductive wire 52 can be considered a nanowire, e.g., can have a width of about 30 nm and a thickness of about 10 nm. The superconductive wire(s) 52 can be arranged to form a plurality of parallel lines, with adjacent lines connected at alternating ends. Although FIG. 8A illustrates four parallel lines, the device could have just two parallel lines, e.g., a U-shaped wire, or a greater number of lines.

Photons, shown by light beam 70, are injected into the device from the side, e.g., generally parallel to the top surface of the substrate 62, through the waveguide layer 66. In particular, the photons can enter along an axis (shown by arrow A) generally parallel to the parallel lines of the wire 52. In addition, along the axis transverse to the direction of light propagation, the wire 52 can be located near the center of the waveguide. For example, on each side of device, there can be a gap 58 between the outer edge of the wire 52 and the outer edge of the waveguide 66. This gap 58 can have a width of about 25-30% of the total width of the waveguide.

In general, because the dielectric layer 64 below the waveguide 66 and the empty space or air above the waveguide 66 both have a lower refractive index than the waveguide 66, the photons in the waveguide 66 are trapped by total internal reflection. However, due to the optical coupling between the waveguide 66 and the nanowire 52, the photons can escape into the nanowires 52 and thus be absorbed by the nanowire 62. The light coupling efficiency can be very high in this type of device.

Figure 9:
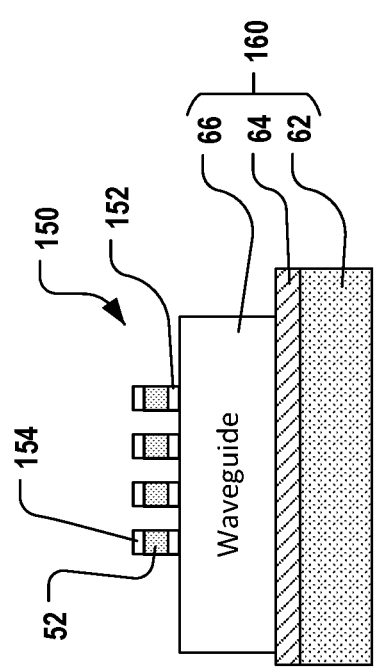
FIG. 9 is a schematic cross-sectional side view of a SNSPD that includes a waveguide and an aluminum nitride seed layer.

FIG. 9 illustrates a cross-sectional side view of a waveguide-configuration of a superconducting nanowire single photon detector (SNSPD) device 150. The SNSPD device 150 can be similar to the devices described above with respect to FIGS. 4 and 8, except as described below.

The SNSPD device 150 includes a substrate 62, such as a silicon substrate.

Covering the top surface of the substrate 62 is the dielectric layer 64. The dielectric layer 64 can be silicon oxide ($SiO_2$), although other materials having a refractive index less than that of the waveguide 66 are possible. The dielectric layer 64 can have a thickness of at least 100 nm, e.g., 200 nm to 2 um.

The waveguide 66 is disposed on the dielectric layer 64. The waveguide 66 can be silicon nitride ($Si_3N_4$), although other materials having a refractive index greater than that of the dielectric layer 64 are possible. The particular thickness and width of the waveguide can be selected based on the wavelength of light to be captured and detected. The waveguide 66 can have a thickness of 400 to 500 nm, e.g., 450 nm, for 1550 nm light. The width of the waveguide 66, i.e., perpendicular to the direction of propagation of the light entering the waveguide 66, can be 1.1 to 1.3 um, e.g., 1.2 um for 1550 nm light.

On the top surface of the waveguide 66, e.g., in direct contact with the waveguide 66, is a metal nitride seed layer 152. The seed layer 152 and the superconductive wires 52 are nitrides of different metals. In particular, the metal nitride of the seed layer 152 can be aluminum nitride (AlN), as this improves the critical temperature of NbN. However, gallium nitride (GaN) might also be suitable. The seed layer 152 can have a thickness of about bout 4 to 50 nm, e.g., about 5 nm or about 10 nm or about 20 nm thickness. The seed layer 152 can have a (002) c-axis crystal orientation. The seed layer 152 is not superconducting at the operating temperature of the device 150.

The superconductive wires 52 are formed on, e.g., in direct contact with, the seed layer 152. The wires are formed of niobium nitride (NbN), titanium nitride (TiN), or niobium titanium nitride ($Nb_xTi_{1-x}N$). The wires 52 can have a width of about 25 to 250 nm, e.g., about 60 nm, and a thickness of 4 to 50 nm, e.g., about 5 nm or about 10 nm or about 20 nm.

A capping layer 154 can cover the superconductive wires 52. The capping layer 154 serves as a protective layer, e.g., to prevent oxidation of the metal nitride of the superconductive wires 52 or other types of contamination or damage. The capping layer 154 can be dielectric or conductive but is not superconductive at the operating temperature of the device 150. The capping layer 154 can be amorphous silicon (a-Si). In some implementations, the capping layer 154 is a nitride of a different material from the metal of the metal nitride used for the superconductive layer 52. Examples of materials for the capping layer 104 include AlN, $Al_2O_3$, $SiO_2$, and SiN. The capping layer 104 can be deposited by a standard chemical vapor deposition or physical vapor deposition process.

Trenches that separate the wires 52 can extend through the capping layer 154, the superconductive layer that provides the wires 52, and the seed layer 152. The trenches need not extend into the waveguide.

Figure 10:
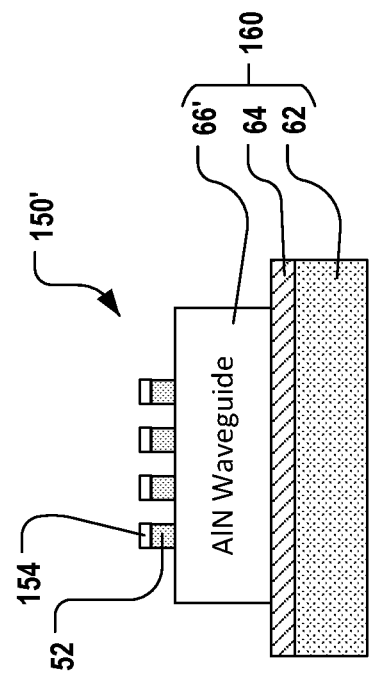
FIG. 10 is a schematic cross-sectional side view of a SNSPD that includes a waveguide formed of aluminum nitride.

FIG. 10 illustrates a cross-sectional side view of another embodiment of a waveguide-configuration of a superconducting nanowire single photon detector (SNSPD) device 150'. The SNSPD device 150' can be similar to the devices described above with respect to FIG. 9, except as described below.

In the embodiment shown in FIG. 10, the waveguide 66' is formed of aluminum nitride (AlN). Thus a separate seed layer is unnecessary, and the waveguide 66' itself acts as the seed layer for the NbN.

The dielectric layer 64 can be silicon oxide ($SiO_2$), although other materials having a refractive index less than that of the aluminum nitride of the waveguide 66' are possible, e.g., silicon nitride ($Si_3N_4$). As noted above, the particular thickness and width of the waveguide can be selected based on the wavelength of light to be captured and detected. The waveguide 66' can have a thickness of 400 to 500 nm, e.g., 450 nm, for 1550 nm light. The width of the waveguide 66', i.e., perpendicular to the direction of propagation of the light entering the waveguide 66', can be 1.1 to 1.3 um, e.g., 1.2 um for 1550 nm light.

The superconductive wires 52 are formed on, e.g., in direct contact with, the waveguide 66'.

While particular implementations have been described, other and further implementations may be devised without departing from the basic scope of this disclosure. It is contemplated that elements and features of one embodiment may be beneficially incorporated in other embodiments without further recitation. It is to be noted, however, that the drawings illustrate only exemplary embodiments. The scope of the invention is determined by the claims that follow.

What is claimed is:

1. A superconducting nanowire single photon detector (SNSPD) device, comprising:
a substrate having a top surface;
an aluminum nitride optical waveguide on the top surface of the substrate to receive light propagating substantially parallel to the top surface of the substrate; and
a niobium nitride superconductive wire disposed directly on the optical waveguide such that the aluminum nitride of the optical waveguide acts as a seed layer to increase a critical temperature of the niobium nitride of the superconductive wire,
wherein the niobium nitride superconductive wire comprises more than two parallel segments connected to each other at alternating ends,
wherein a gap between an outer edge of a segment of the niobium nitride superconductive wire that is closest to an outer edge of the aluminum nitride optical waveguide and the outer edge of the aluminum nitride optical waveguide is in a range of 25%-30% of a total width of the aluminum nitride optical waveguide.

2. The device of claim 1, comprising a dielectric layer between the substrate and the aluminum nitride optical waveguide, the dielectric layer being a first material having a first index of refraction that is less than a second index of refraction of the aluminum nitride of the optical waveguide.

3. The device of claim 2, wherein the first material is silicon oxide (SiO2).

4. The device of claim 1, wherein the optical waveguide has a thickness of 400 to 500 nm.

5. The device of claim 1, wherein the optical waveguide has a width of 1.1 to 1.3 um.

6. The device of claim 1, wherein the superconductive wire has a thickness of 4 to 50 nm.

7. The device of claim 1, wherein the superconductive wire has a width of 25 to 250 nm.

8. The device of claim 1, further comprising a capping layer on the superconductive wire.

9. A superconducting nanowire single photon detector (SNSPD) device, comprising:
 a substrate having a top surface;
 a metal nitride optical waveguide on the top surface of the substrate to receive light propagating substantially parallel to the top surface of the substrate; and
 a titanium nitride superconductive wire disposed directly on the optical waveguide, the metal nitride of the optical waveguide being different from titanium nitride,
 wherein the titanium nitride superconductive wire comprises more than two parallel segments connected to each other at alternating ends,
 wherein a gap between an outer edge of a segment of the titanium nitride superconductive wire that is closest to an outer edge of the metal nitride optical waveguide and the outer edge of the metal nitride optical waveguide is in a range of 25%-30% of a total width of the metal nitride optical waveguide.

10. The device of claim 9, comprising a dielectric layer between the substrate and the metal nitride optical waveguide, the dielectric layer being a first material having a first index of refraction that is less than a second index of refraction of the metal nitride of the optical waveguide.

11. The device of claim 10, wherein the first material is silicon oxide (SiO2).

12. The device of claim 9, wherein the optical waveguide has a thickness of 400 to 500 nm.

13. The device of claim 9, wherein the optical waveguide has a width of 1.1 to 1.3 um.

14. The device of claim 9, wherein the superconductive wire has a thickness of 4 to 50 nm.

15. The device of claim 9, wherein the superconductive wire has a width of 25 to 250 nm.

16. The device of claim 9, further comprising a capping layer on the superconductive wire.

* * * * *